(12) United States Patent
Bhat et al.

(10) Patent No.: US 9,954,144 B2
(45) Date of Patent: Apr. 24, 2018

(54) WAFER LEVEL CONTACT PAD SOLDER BUMPING FOR SURFACE MOUNT DEVICES WITH NON-PLANAR RECESSED CONTACTING SURFACES

(71) Applicant: Cree, Inc., Durham, NC (US)

(72) Inventors: Chandan Bhat, Goleta, CA (US); Theodore Lowes, Lompoc, CA (US)

(73) Assignee: CREE, INC., Durham, NC (US)

( * ) Notice: Subject to any disclaimer, the term of this patent is extended or adjusted under 35 U.S.C. 154(b) by 0 days.

(21) Appl. No.: 14/152,829

(22) Filed: Jan. 10, 2014

(65) Prior Publication Data
US 2015/0200335 A1    Jul. 16, 2015

(51) Int. Cl.
*H01L 33/46*   (2010.01)
*H01L 33/48*   (2010.01)
*H01L 33/62*   (2010.01)

(52) U.S. Cl.
CPC ............ *H01L 33/486* (2013.01); *H01L 33/62* (2013.01); *H01L 33/46* (2013.01); *H01L 2224/11* (2013.01); *H01L 2933/0066* (2013.01)

(58) Field of Classification Search
CPC .......... H01L 33/36–33/42; H01L 33/48; H01L 33/486
See application file for complete search history.

(56) References Cited

U.S. PATENT DOCUMENTS

| 6,111,272 | A  | * | 8/2000  | Heinen ............... H01L 33/0079 257/94 |
| 6,784,460 | B2 | * | 8/2004  | Ng ..................... H01L 33/20 257/100 |
| 7,589,351 | B2 |   | 9/2009  | Hsieh ........................ 257/100 |
| 8,203,218 | B2 |   | 6/2012  | Kim |
| 8,242,517 | B2 | * | 8/2012  | Shen ..................... H01L 33/44 257/84 |
| 8,444,882 | B2 | * | 5/2013  | Kanisawa ................ C09J 7/00 252/500 |
| 8,581,291 | B2 | * | 11/2013 | Shimokawa ........ H01L 33/0079 257/99 |
| 2007/0131956 | A1 | * | 6/2007 | Lin ........................ H01L 33/02 257/98 |
| 2008/0035948 | A1 |   | 2/2008 | Shin |

(Continued)

OTHER PUBLICATIONS

U.S. Appl. No. 14/053,404, filed Oct. 14, 2013, Heikman, et al.
(Continued)

*Primary Examiner* — Eric Ward
(74) *Attorney, Agent, or Firm* — Koppel, Patrick, Heybl & Philpott (57) ABSTRACT

This disclosure related to surface mount devices, such as light emitting devices, and methods of manufacture thereof, including recessed contact pads with protruding contact bumps. Embodiments according to the present disclosure include a light emitting device, wherein the device comprises at least a contact pad, such that the contact pad is recessed in relation to a surface of the device. Contact bumps are formed in contact with the contact pads, such that the contact bumps protrude beyond the surface and may contact a surface of a submount that the device is meant to be mounted to. Methods of manufacture including methods utilizing virtual wafer structures are also disclosed.

45 Claims, 7 Drawing Sheets

(56) References Cited

U.S. PATENT DOCUMENTS

| | | | |
|---|---|---|---|
| 2010/0051995 A1* | 3/2010 | Katsuno | H01L 33/44 257/98 |
| 2011/0114978 A1* | 5/2011 | Kojima | H01L 33/382 257/98 |
| 2011/0147774 A1* | 6/2011 | Wang | H01L 33/46 257/98 |
| 2011/0291143 A1 | 12/2011 | Kim | 257/98 |
| 2012/0193666 A1 | 8/2012 | Namiki | |
| 2012/0248485 A1* | 10/2012 | Shinbori | H01L 33/56 257/98 |
| 2013/0037842 A1 | 2/2013 | Yamada | |
| 2013/0240934 A1 | 9/2013 | Park | |
| 2013/0288409 A1* | 10/2013 | Chen | H01L 33/44 438/29 |
| 2014/0175466 A1* | 6/2014 | de Samber | H01L 25/0753 257/88 |
| 2014/0231839 A1* | 8/2014 | Jeon | H01L 33/46 257/96 |
| 2015/0243862 A1 | 8/2015 | Sheng | |

OTHER PUBLICATIONS

Office Action from U.S. Appl. No. 14/201,490: dated Dec. 31, 2015.
Office Action for U.S. Appl. No. 14/201,490; dated Sep. 7, 2016.
Office Action for U.S. Appl. No. 14/201,490; dated Feb. 14, 2017.
Office Action for U.S. Appl. No. 14/201,490; dated Jul. 28, 2017.

* cited by examiner

WAFER LEVEL CONTACT PAD SOLDER BUMPING FOR SURFACE MOUNT DEVICES WITH NON-PLANAR RECESSED CONTACTING SURFACES

BACKGROUND OF THE INVENTION

Field of the Invention

Described herein are devices and methods relating to surface mount devices, such as light emitting diode (LED) chips and components, including LED chips, which have recessed contact pads.

Description of the Related Art

Surface mount devices, such as LED-based light emitting devices, are increasingly being used in lighting/illumination applications. Semiconductor LEDs are widely known solid-state lighting elements that are capable of generating light upon application of voltage thereto. LEDs generally include a diode region having first and second opposing surfaces, and including therein an n-type layer, a p-type layer and a p-n junction. An anode contact ohmically contacts the p-type layer and a cathode contact ohmically contacts the n-type layer. In some cases, the diode region may be epitaxially formed on a substrate, such as a sapphire, silicon, silicon carbide, gallium arsenide, gallium nitride, etc., or growth substrate, but the completed device may have the substrate removed. The diode region may be fabricated, for example, from silicon carbide, gallium nitride, gallium phosphide, aluminum nitride and/or gallium arsenide-based materials and/or from organic semiconductor-based materials. In other configurations, it may be possible for the device to never include a substrate, such as if grown or processed on a virtual wafer.

Submounts are generally used in LED devices to interpose an LED chip and a printed circuit board. The submount may change the contact configuration of the LED chip to be compatible with the pads of the printed circuit board. The submount may also be used to support a phosphor layer or an encapsulating dome that surrounds the LED chip. The submount may also provide other functionality. Thus, a submount may include a receiving element onto which an LED chip is mounted using conventional die-attach techniques, to interface the LED chip and a printed circuit board. A submount generally has a thickness of at least 100 μm, and in some embodiments at least 150 μm, and in other embodiments at least 200 μm, and generally includes traces (such as on ceramic panels) and/or leads (such as in a Plastic Leaded Chip Carrier (PLCC) package).

The color or wavelength emitted by an LED is largely dependent on the properties of the material from which it is generated, such as the bandgap of the active region. LEDs have been built to emit light in a range of colors in the visible spectrum including red, yellow, green, and blue. Other LEDs emit in the ultraviolet (UV) range of the electromagnetic spectrum. It is often desirable to incorporate phosphors into a LED to tailor the emission spectrum by converting all or a portion of the light from the LED before it is emitted as it passes through. For example, in some blue LEDs, a portion of the blue light is "downconverted" to yellow light. Thus, the LED emits a combination of blue and yellow light to generate a spectrum that appears white to the human eye. This is known as a blue-shifted yellow (BSY) LED device. As used herein, the term "phosphor" is used generically to indicate any photoluminescent material.

Because of the above issues, the application of a conversion layer to an LED chip is typically done at the package level after the LEDs have already been singulated and subsequently bonded to an electronic element, such as a PCB. However, applying a conversion material at the package level rather than the wafer level is a less efficient manufacturing process, as it is much easier and cost effective to coat multiple LED chips simultaneously at the wafer level.

It is desirable to complete as many steps as possible at the wafer level rather than at the package level, as it is more efficient to do so for manufacturing purposes. For surface mount devices, which have recessed contact pads in relation to the mounting surface of the device, these contacts to the mount surface at this time are being formed by adding gull wing type attachments to the contact pads at a package level. Otherwise, large amounts of metal paste are added to the mount surface in the hopes that during the mounting process this metal paste will enter the recessed areas and make contact with the contact pads. Unfortunately, this process can be unreliable, include low yields with regard to successful bonding, and can result in imbalanced devices or unbalanced amounts of material on each contact pad of the device. It would be desirable to utilize a more reliable and controlled process to create contacts, preferably at the wafer level, which could also increase manufacturing efficiencies.

SUMMARY OF THE INVENTION

The present invention discloses new devices and methods for fabricating surface mount or solid state devices, such as LED chips and providing bumped contacts for recessed contact pads at the wafer level. One embodiment of a device according to the present disclosure includes a surface mount device, comprising a mounting surface and one or more contact pads disposed on the device, such that the contact pads are positioned recessed in relation to the remainder of the mounting surface. The device further includes contact bumps formed on the contact pads, the contact bumps protruding beyond the mounting surface.

A second embodiment according to the present disclosure may include a light emitting device chip wafer, comprising a plurality of light emitting devices. These devices comprise a mounting surface and one or more contact pads disposed on the device, such that the contact pads are positioned recessed in relation to the remainder of the mounting surface. The devices also include contact bumps formed on the contact pads, the contact bumps protruding beyond the mounting surface.

The disclosure also discusses methods of forming such devices, such that one embodiment of a method according to the present disclosure includes a method of fabricating wafer level light emitting device chips, comprising providing a plurality of light emitting devices as a wafer. These devices comprise at least a contact pad, such that the contact pad is recessed in relation to a surface of the device. The method additionally includes providing a stencil over the plurality of devices and providing a solder material over the stencil. The method also includes disposing said material over the contact pads and forming the material into contact bumps in contact with the contact pads, the contact bumps protruding beyond the surface.

Yet another method according to an embodiment of the present disclosure includes a method of fabricating level light emitting device chips, comprising providing a light emitting device. This device comprises at least a contact pad, such that the contact pad is recessed in relation to a surface of the device. The method also comprises disposing a solder material over the contact pads and forming the material into contact bumps in contact with the contact pads, the contact bumps protruding beyond the surface.

Various embodiments described herein may arise from a recognition that other techniques may be used to modify the contact sizes or spacing for greater compatibility with printed circuit board pads and/or other techniques may be used to provide a phosphor layer and/or a dome or other encapsulation layer on an LED chip without the need to provide a separate submount or interposer between the LED chip and the printed circuit board. For example, contact bumps may be formed over the anode and/or cathode contacts of an LED chip to increase the effective contact height of the anode and cathode contacts.

These and other further features and advantages of the invention would be apparent to those skilled in the art from the following detailed description, taken together with the accompanying drawings, wherein like numerals designate corresponding parts in the figures, in which:

DETAILED DESCRIPTION OF THE INVENTION

The present disclosure will now set forth detailed descriptions of various embodiments. These embodiments provide methods and devices pertaining to surface mount devices and solid state devices, such as light emitting devices, various light emitters, LED chips, LED wafers, LED components, and methods of manufacture thereof. Embodiments incorporating features of the present invention allow for the efficient addition of contact bumps to recessed contact pads.

In some embodiments incorporating features of the present invention, solid state devices, such as LED chips, are provided with contact bumps arranged such that they are uniform in size and protrude from the mounting surface of the device, enabling the contact bumps to make contact with mount surfaces. The contact bumps are provided in contact with contact pads on the device. In some configurations, the contact pads are recessed in relation to the mounting surface of the device. The mounting surface of the device is the surface, which will be adjacent to the mount surface that the device is being mounted to. In other arrangements, the contact pads may not be recessed, but the mount surface which the device will be mounted to may have recessed portions that the device will need to contact for an electrical connection. In some embodiments, according to the present invention, the contact bumps are formed at the wafer level by a process which utilizes a stencil, the contact bump material, and a squeegee or blade for distributing the material in equal amounts to the device through the stencil. This equal distribution allows contact bumps of uniform size to be made at the wafer level for a plurality of devices. Embodiments according to the present disclosure can allow for devices to be efficiently provided with contact bumps at a wafer, "virtual wafer" or array level.

Embodiments incorporating features of the present invention can also include various structures to improve stability of a light emitter array, such as an LED chip array, during the manufacturing process, such as additional adhesive and/or virtual wafers comprising a silicone support, a glass support and/or a frame structure.

Some embodiments of light emitter components according to the present disclosure utilize a reflective material, such as a white diffusive paint or coating, metal reflector, or other type of reflective surface, to further improve light extraction and emission uniformity. This reflective layer may be applied to the bottom or mounting surface of the device. The thickness of this layer may, at least in part, cause the contact pads to be recessed in relation to the highest portions of the mounting surface of the device, as the addition of the reflective layer may increase the height of the surface. In other embodiments, the contact pads may be recessed due to other reasons.

In the description that follows, numerous details are set forth in order to provide a thorough understanding of the invention. It will be appreciated by those skilled in the art that variations of these specific details are possible while still achieving the results of the invention. Well-known elements and processing steps are generally not described in detail in order to avoid unnecessarily obscuring the description of the invention.

Embodiments of the invention are described herein with reference to illustrations that are schematic illustrations of embodiments of the invention. As such, the actual size, components and features can be different, and variations from the shapes of the illustrations as a result, for example, of technological capabilities, manufacturing techniques and/or tolerances are expected. Embodiments of the invention should not be construed as limited to the particular shapes or components of the regions illustrated herein but are to include deviations in shapes/components that result, for example, from manufacturing or technological availability. The regions illustrated in the figures are schematic in nature and their shapes are not intended to illustrate the precise shape or functionality of a feature of a device and are not intended to limit the scope of the invention. In addition, components may be shown as one unit but may instead be a collection of components or units, or a collection of components or units may exist as one unit.

Throughout this description, the preferred embodiment and examples illustrated should be considered as exemplars, rather than as limitations on the present invention. As used herein, the term "invention," "device," "method," "present invention," "present device" or "present method" refers to any one of the embodiments of the invention described herein, and any equivalents. Furthermore, reference to various feature(s) of the "invention," "device," "method," "present invention," "present device" or "present method" throughout this document does not mean that all claimed embodiments or methods must include the referenced feature(s).

It is also understood that when an element or feature is referred to as being "on", "contacting" or "adjacent" to another element or feature, it can be directly on or adjacent to the other element or feature or intervening elements or features may also be present. It is also understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "outer", "above", "lower", "below", "horizontal", "vertical" and similar terms, may be used herein to describe a relationship of one feature to another. It is understood that these terms are intended to encompass different orientations in addition to the orientation depicted in the figures.

Although the terms first, second, etc. may be used herein to describe various elements or components, these elements or components should not be limited by these terms. These terms are only used to distinguish one element or component from another element or component. Thus, a first element or component discussed below could be termed a second element or component without departing from the teachings of the present invention. As used herein, the term "and/or" includes any and all combinations of one or more of the associated list items.

The terminology used herein is for describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," when used herein, specify the presence of stated features, integers, steps, operations, elements, and/or components, but do not preclude the presence or addition of one or more other features, integers, steps, operations, elements, components, and/or groups thereof.

It is noted that the terms "layer" and "layers" are used interchangeably throughout the application. A person of ordinary skill in the art will understand that a single "layer" of material may actually comprise several individual layers of material. Likewise, several "layers" of material may be considered functionally as a single layer. In other words the term "layer" does not denote a homogenous layer of material. A single "layer" may contain various material concentrations and compositions that are localized in sub-layers. These sub-layers may be formed in a single formation step or in multiple steps. Unless specifically stated otherwise, it is not intended to limit the scope of the invention as embodied in the claims by describing an element as comprising a "layer" or "layers" of material.

Though the contact pad and bump structures described herein may be used with any device, surface mount device, or solid state device, various embodiments described herein can relate to LED components, which eliminate the need for a submount or interposer between an LED chip and a printed circuit board on which an LED chip is mounted, thereby reducing the cost, size and/or complexity of these devices.

Moreover, LED chips that do not include a submount may be placed on a tape, coated with a phosphor layer and, optionally, also coated with a transparent layer that is free of phosphor, removed from the tape and then soldered to a printed circuit board without the need for an intervening submount. Other techniques may also be used to provide submount-free LED components and methods of manufacturing the same, according to various embodiments described herein. A wafer of the submount-free devices consists of a monolithic periodic array of chips. In some embodiments, these include an integrated wavelength converter and integrated encapsulant, but no substrate or submount on the bottom, such as a PCB or ceramic carrier.

In order for these submount or substrate free devices to achieve the performance parity with traditional components, it may be desirable to selectively coat the bottom of the wafer with a reflector or highly reflective material. In some embodiments, the thickness of this reflective material may be 5-200 microns. In other embodiments, this thickness may be 25-150 microns. In yet other embodiments, other thicknesses may be used to achieve the desired reflectivity. This reflective material coating must encroach inside the outer periphery of the chip, up to, but not covering the contact pads. The thickness of this material, which may exceed that of the contact pads, makes attaching and reliably connecting the device to a circuit board or other mounting surface very difficult, as the contact pads are recessed in relation to the rest of the bottom or mounting surface of the device.

Figure 1:
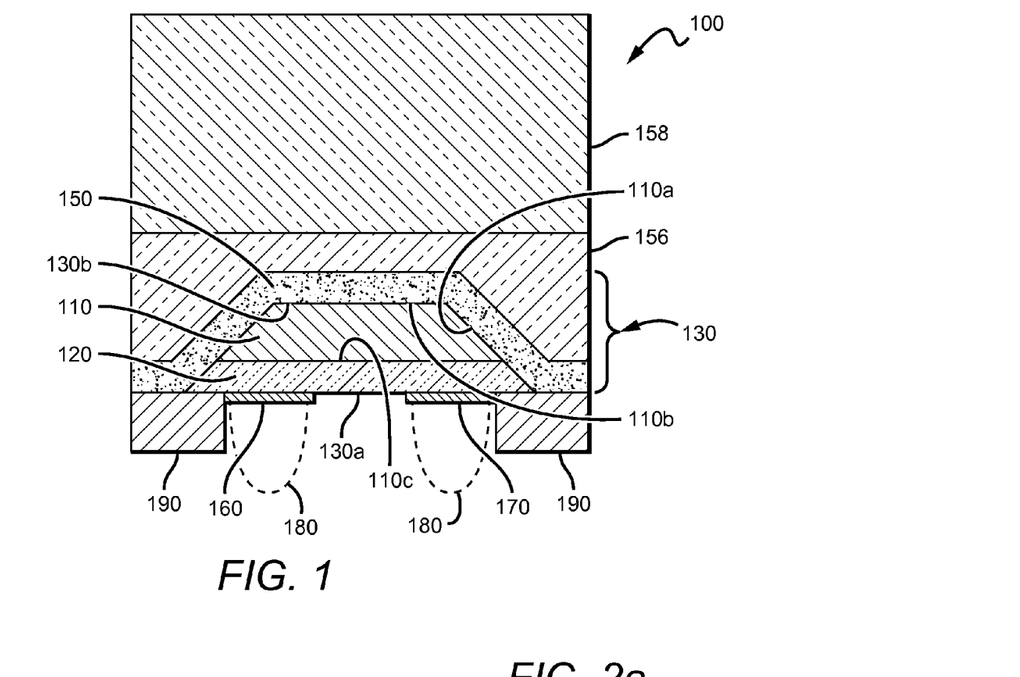
FIG. 1 is a cross-sectional side view of a device according to one embodiment of the present disclosure.

FIG. 1 is a cross-sectional view of a light emitting device according to various embodiments described herein. Referring now to FIG. 1, the light emitting device 100 includes a Light Emitting Diode (LED) chip 130 having first and second opposing faces 130a and 130b, respectively. The LED chip 130 includes a diode region 120 that includes therein an n-type layer and a p-type layer. Other layers or regions may also be provided in the diode region 120, which may include quantum wells, buffer layers, etc., that are understood in the art and need not be described herein. Moreover, the n-type layer and the p-type layer may be adjacent to one another to form a p-n junction or may be spaced apart from one another. The diode region 120 may also be referred to herein as an "LED epi region", because it is typically formed epitaxially on a substrate. For example, a Group III-nitride based LED epi 120 may be formed on a silicon carbide growth substrate. In some embodiments, the growth substrate may be present in the finished product. In other embodiments, the growth substrate may be removed. In still other embodiments, another substrate may be provided that is different from the growth substrate, and the other substrate may be bonded to the LED epi region after removing the growth substrate.

As also shown in FIG. 1, a transparent substrate 110, such as a transparent silicon carbide growth substrate or a transparent sapphire growth substrate, is provided on the diode region 120. As used herein, a layer or region of an LED is considered to be "transparent" when at least 50% of the radiation from the LED that impinges on the transparent layer or region emerges through the transparent region. The transparent substrate 110 may include a sidewall 110a and may also include a first (inner) face 110c adjacent the diode region 120 and a second (outer) face 110b remote from the first face 110c. In some embodiments, the second face 110b is of smaller surface area than the first face 110c. Moreover, in some embodiments, the sidewall 110a may be stepped, beveled and/or faceted, so as to provide the second face 110b that is of smaller surface area than the first face 110c. In other embodiments, the sidewall 110a is an oblique sidewall that extends at an oblique angle from the second face 110b to the first face 110c. Non-oblique sidewalls and approximately equal size faces may be also be provided in other embodiments. For example, a square or rectangular chip with straight or non-oblique sidewalls may also be used in some embodiments.

Still referring to FIG. 1, an anode contact 160 ohmically contacts the p-type layer and extends on the first face 130a of the LED chip 130. A cathode contact 170 ohmically contacts the n-type layer and also extends on the first face 130a of the LED chip 130. The device of FIG. 1 is a lateral geometry device; however, vertical geometry devices may also be used. The anode and cathode contacts may directly ohmically contact the n-type layer and the p-type layer, respectively, or may ohmically contact these layers by way of one or more conductive vias and/or other intermediate layers. Moreover, as illustrated in FIG. 1, the anode contact 160 and the cathode contact that both extend on the first face 130a are approximately flat and co-planar. In other embodiments, they may not be flat or co-planar. As also shown in FIG. 1, the anode contact 160 and the cathode contact 170 are spaced apart from one another on the first face 130a, to define gap there between. The anode and cathode contacts 160 and 170 may be less than about 10 μm thick in some embodiments and may be less than about 5 μm thick in other embodiments.

FIG. 1 also shows portions 190 which extend below surface 130a and the contacts 160, 170. As described above, portions 190 may be a reflective layer or other structural portion, which extends below surface 130a. In some embodiments, this may be a submount or any other feature. In other embodiments, portion 190 may be a dielectric material, or a polymeric material. In yet other embodiments, portion 190 may include reflective particles in a polymeric matrix, such as a white reflective material. In other embodiments, portions 190 may include other optical elements, or other particles, such as diffusers, reflectors, and/or scattering particles. In one example, the matrix may include a conversion material, such as phosphor. In addition, portions 190 may be disposed to improve thermal conductivity. The portions 190 extending below surface 130a of FIG. 1 are a reflective layer, examples of such reflective layers include a dielectric mirror, a white reflective layer, such as a titania-filled layer, and/or other white/reflective layer. Many different reflectors can be used including a mirror layer comprising silver, diffuse reflectors, materials comprising a reflective white color, and thin film reflectors, such as metal or dielectric layers. In other embodiments, this reflective layer may have other thicknesses, including some which do not exceed the thickness of the contacts 160, 170. Furthermore, in other embodiments, the reflective layer shown by portions 190 may also extend between the contacts 160, 170. In embodiments where the reflective layer 190 exceeds the height of the contact pads 160, 170, it is desirable to generate a contact with enough material to overcome the height barrier of the reflective layer and also to have a balanced amount of material on both contact pads so that uniform attachment is achieved.

Some embodiments may include a solder mask over portions of the bottom surface 130a, which do not include contact pads 160 and 170. A solder mask may comprise any material that is generally used in microelectronic manufacturing to physically and electrical insulate those portions of the circuit to which no solder or soldering is desired. Solder masks may include thermally cured screen-printed masks, dry film and/or screen-applied or curtain-coated liquid photoimageable solder masks. In some embodiments, the solder mask may comprise a conventional photoresist, or any other material that is non-wettable to solder. A solder mask may be less than about 30 μm thick in some embodiments, less than about 5 μm thick in other embodiments, and may be about 1 μm thick or less in still other embodiments. A wide range of thicknesses and materials may be used, as long as effective solder masking takes place. Moreover, in other embodiments, the solder mask may also include virtually any non-metallic coating, such as silicon dioxide and/or silicon nitride, which may be deposited by physical and/or chemical deposition techniques. In still other embodiments, the solder mask may be reflective, so as to reflect optical radiation that emerges from the diode region 120, back into the diode region 120. Examples of such reflective layers include a dielectric mirror, a white reflective layer, such as a titania-filled layer, and/or other white/reflective layer.

Still referring to FIG. 1, a phosphor layer 150 is provided on the second face 130b of the LED chip 130. As shown in FIG. 1, the phosphor layer 150 may also extend onto the sidewall 110a of the substrate, onto the sidewall of the diode region 120, and/or beyond, or extending beyond the width of, the anode and cathode contacts 160 and 170. In some embodiments, the phosphor layer 150 is a conformal phosphor layer that may be less than about 150 μm thick in some embodiments, less than about 100 μm thick in other embodiments and less than about 50 μm thick in yet other embodiments. It will be understood that the term "phosphor" is used herein to denote any wavelength conversion material, and may be provided according to various configurations. Phosphor layer 150 may also be any type of functional layer or layers, such as any layer disposed to affect the properties of the emitted light, for example, color, intensity and/or direction.

Various techniques may be used to apply the phosphor layer 150, including dispensing, screen printing, film transfer, spraying, coating and/or other techniques. Phosphor preforms also may be applied. In some embodiments, the phosphor layer 150 may comprise silicone and/or other transparent material having phosphor particles therein. It will also be understood that the phosphor layer 150 is shown in FIG. 1 to be co-planar with the outer face 130a of the diode 130. However, the outer or edge portions of the phosphor layer 150 need not be co-planar with these outer faces. Specifically, it can be recessed from the outer face 130a or may protrude beyond the contacts 160, 170.

Moreover, FIG. 1 illustrates the phosphor layer 150 as a thin conformal layer having uniform phosphor particle density. However, a phosphor layer may be provided that comprises phosphor particles that are non-uniformly dispersed therein, and that, in some embodiments, may include a phosphor-free region at the exterior surfaces of the phosphor layer. Moreover, the phosphor layer may also be configured as a conformal layer.

The phosphor layer 150, or any wavelength conversion layer, converts a portion of the light emitted from the diode 120 to a different wavelength, a process that is known in the art. One example of this process, is converting a portion of blue-emitted light from light emitter, such as an LED chip, to yellow light. Yttrium aluminum garnet (YAG) is an example of a common phosphor that may be used.

In some embodiments, the phosphor particles comprise many different compositions and phosphor materials alone or in combination. In one embodiment the single crystalline phosphor can comprise yttrium aluminum garnet (YAG, with chemical formula $Y_3Al_5O_{12}$). The YAG host can be combined with other compounds to achieve the desired emission wavelength. In one embodiment where the single crystalline phosphor absorbs blue light and re-emits yellow, the single crystalline phosphor can comprise YAG:Ce. This embodiment is particularly applicable to light emitters that emit a white light combination of blue and yellow light. A full range of broad yellow spectral emission is possible using conversion particles made of phosphors based on the $(Gd,Y)_3(Al,Ga)_5O_{12}$:Ce system, which include $Y_3Al_5O_{12}$:Ce (YAG). Other yellow phosphors that can be used for white emitting LED chips include:

$Tb_{3-x}RE_xO_{12}$: Ce (TAG);
RE=Y, Gd, La, Lu; and/or
$Sr_{2-x-y}Ba_xCa_ySiO_4$:Eu.

In other embodiments, other compounds can be used with a YAG host for absorption and re-emission of different wavelengths of light. For example, a YAG:Nb single crystal phosphor can be provided to absorb blue light and re-emit red light. First and second phosphors can also be combined for higher CRI white warm white) with the yellow phosphors above combined with red phosphors. Various red phosphors can be used including:

$Sr_xCa_{1-x}S$:Eu,Y; Y=halide;
$CaSiAlN_3$:Eu; or
$Sr_{2-y}Ca_ySiO_4$:Eu.

Other phosphors can be used to create saturated color emission by converting substantially all light to a particular color. For example, the following phosphors can be used to generate green saturated light:

$SrGa_2S_4$:Eu;
$Sr_{2-y}Ba_ySiO_4$:Eu; or
$SrSi_2O_2N_2$:Eu.

The following lists some additional suitable phosphors that can be used as conversion particles, although others can be used. Each exhibits excitation in the blue and/or UV emission spectrum, provides a desirable peak emission, has efficient light conversion:

Yellow/Green
$(Sr,Ca,Ba) (Al,Ga)_2S_4$:$Eu^{2+}$
$Ba_2(Mg,Zn)Si_2O_7$:$Eu^{2+}$
$Gd_{0.46}Sr_{0.31}Al_{1.23}O_xF_{1.38}$:$Eu^{2+}_{0.06}$
$(Ba_{1-x-y}Sr_xCa_y)SiO_4$:Eu
$Ba_2SiO_4$=$Eu^{2+}$ Red
$Lu_2O_3$=$Eu^{3+}$
$(Sr_{2-x}La_x) (Cei_{1-x}Eu_x)O_4$
$Sr_2C_{1-x}Eu_xO_4$
$SrTiO_3$:$Pr^{3+},Ga^{3+}$
$CaAlSiN_3$I$Eu^{2+}$
$Sr_2Si_5N_8$=$Eu^{2+}$ In some embodiments, the layer 150 is a functional layer which comprises a light scattering layer, which comprises a binder material as discussed above and light scattering particles, for example titanium oxide particles. In other embodiments, the layer comprises materials to alter the refractive index of the functional layer. In some embodiments, the functional layer comprises a combination of one or more of the types of functional layers described herein (e.g. a wavelength conversion layer and a scattering or refractive index altering layer).

In some embodiments, the diode region 120 is configured to emit blue light, for example light having a dominant wavelength of about 450-460 nm, and the phosphor layer 150 comprises yellow phosphor, such as YAG:Ce phosphor, having a peak wavelength of about 550 nm. In other embodiments, the diode region 120 is configured to emit blue light upon energization thereof, and the phosphor layer 150 may comprise a mixture of yellow phosphor and red phosphor, such CASN-based phosphor. In still other embodiments, the diode region 120 is configured to emit blue light upon energization thereof, and the phosphor layer 150 may comprise a mixture of yellow phosphor, red phosphor and green phosphor, such as LuAG:Ce phosphor particles. Moreover, various combinations and subcombinations of these and/or other colors and/or types of phosphors may be used in mixtures and/or in separate layers. In still other embodiments, a phosphor layer is not used. For example, a blue, green, amber, red, etc., LED need not use phosphor. In embodiments which do use a phosphor, it may be beneficial to provide a uniform coating in order to provide more uniform emissions.

Still referring to FIG. 1, an outer transparent layer 156, for example, comprising silicone without phosphor particles therein, may also be provided to provide a primary optic for the light emitting device 100. The transparent layer 156 that is free of phosphor may be shaped to provide a lens, dome and/or other optical component, so that the sides and/or tops thereof may be oblique to the diode region. The transparent layer 156 that is free of phosphor may also encapsulate the phosphor layer 150 and/or light emitting surfaces of the LED chip 130. The transparent layer 156 may be at least 1.5 mm thick in some embodiments, at least 0.5 mm thick in other embodiments, and at least 0.01 mm thick in yet other embodiments, and may not be present in still other embodiments. Thus, in other embodiments, a transparent layer may be used without a phosphor layer 150. For example, the transparent layer 156 may be directly on the second face 130b of the LED chip 130. In some embodiments, a relatively thick transparent layer may be used. In other embodiments, a conformal transparent layer may be used. In still other embodiments, the transparent layer may be provided on a phosphor layer that comprises phosphor particles that are non-uniformly dispersed therein. The device may further include an additional encapsulant or lens 158, which may be silicon or glass. Other embodiments may not include this additional lens 158.

Figure 2A:
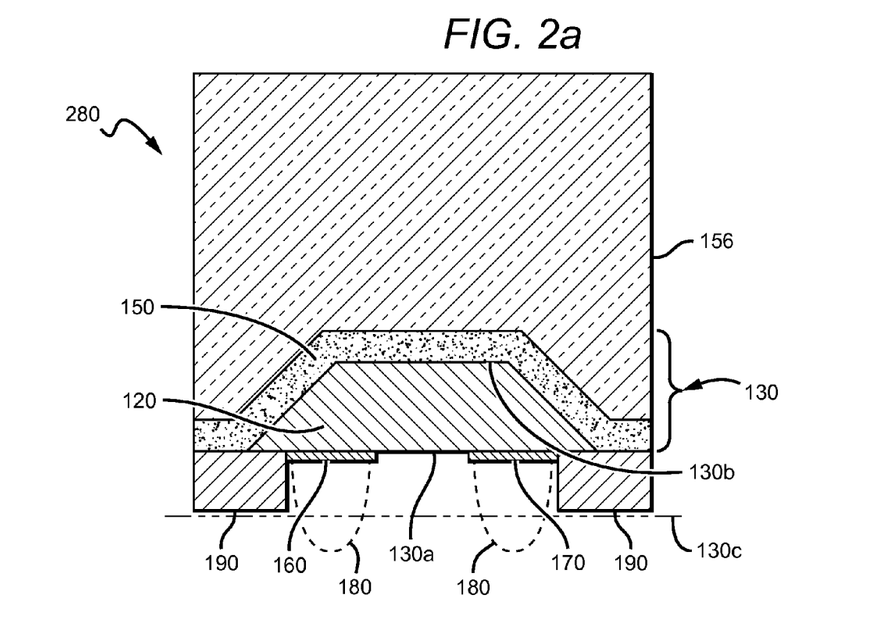
FIG. 2a is a cross-sectional side view of a device according to another embodiment of the present disclosure.

FIG. 2a is a cross-sectional view of a light emitting device 280. Features similar to those found in FIG. 1 are referred to by the same numerals for ease of reference. The chip 130 of FIG. 2a differs from that of FIG. 1 in that it does not include a substrate 110, but rather is just the diode 120. The substrate may have been removed prior to the device being placed on an adhesive or glass layer for further processing.

The devices of FIGS. 1 and 2a can also be manufactured as components integrated into other electronic devices. As such, the devices may need to be mounted or connected to a substrate, which can comprise an electronic element, for example a PCB. However, as it can be noted from FIGS. 1 and 2a, the contact pads 160, 170 are recessed from the mounting surface 130c or the lowest point of the mounting surface of the device 280. Though it is possible to provide a mass amount of mounting paste on the mounting surface or PCB that the device is to be mounted to, to reach recessed contacts, this does not ensure that a connection will be made to the mounting pads 160, 170, resulting in low yields, and this may also result in different amounts of paste being disposed on the different contact pads 160, 170 causing an unbalanced or crooked mount. Instead, it is preferable to include contact bumps 180.

Figure 2B:
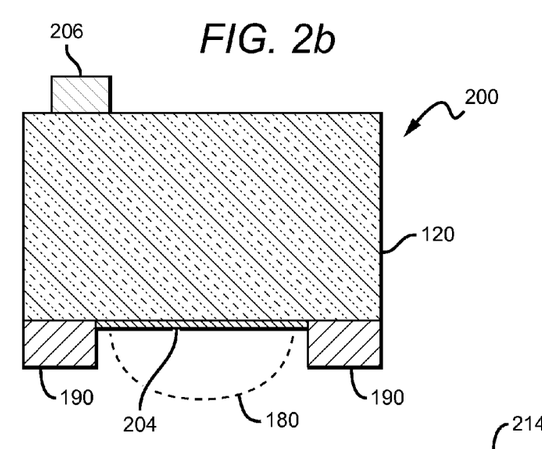
FIG. 2b is a cross-sectional side view of a device according to another embodiment of the present disclosure.

FIG. 2b is a cross-sectional view of a light emitting device 200, another embodiment according to the present disclosure. Features similar to those found in FIGS. 1 and 2a are referred to by the same numerals for ease of reference. The chip 120 of FIG. 2b differs from that of FIG. 2a in that it is a vertical device. Therefore, the device has a singular bottom contact 204 and a top contact 206. Additionally, it may include a conductive growth substrate (not shown) or instead the diode region may be bonded to a conductive carrier substrate, such as those described above. Also, the chip 120 of FIG. 2b is a different geometry than that of FIG. 2a. However, it should be noted that a chip of any shape may be utilized. The device 200 of FIG. 2b may include a conversion material and encapsulant over the chip 120, but other embodiments may not include these.

Figure 2C:
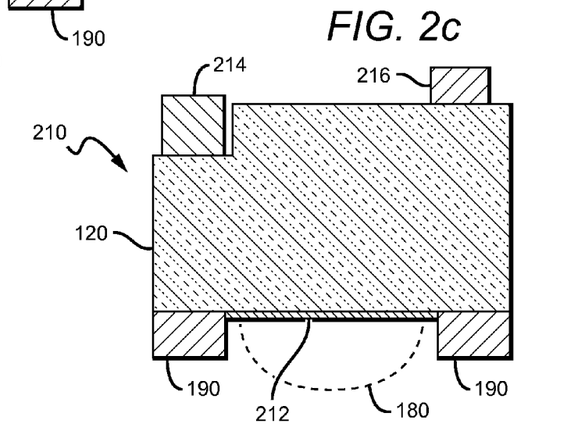
FIG. 2c is a cross-sectional side view of a device according to another embodiment of the present disclosure.

FIG. 2c is a cross-sectional view of a light emitting device 210, another embodiment according to the present disclosure. Features similar to those found in FIGS. 1-2b are referred to by the same numerals for ease of reference. The chip 120 of FIG. 2c differs from that of FIG. 2a in that it may be a lateral device with top-side contacts; for example, both contacts 214, 216 of the device are on a surface opposite that of the mounting surface. Therefore, the device has a bottom mounting or die attach pad 212 which is used to attach the device 210 to a mounting surface. The mounting pad or die attach pad 212, in some embodiments, is not electrically connected to the chip 120. In some embodiments, the die attach pad may serve to provide a thermal path to improve heat efficiency of the device. Additionally, the device may include a conductive or insulating growth substrate (not shown) or instead the diode region may be bonded to a carrier substrate, such as those described above. The device 210 of FIG. 2c may include a conversion material and encapsulant over the chip 120, but other embodiments may not include these. It should be noted that any size or shape diode region or chip may be utilized. In yet other embodiments, a vertical device may be utilized with a top contact, bottom contact, and additionally at least one bottom mounting pad or die attach pad.

Figure 3A:
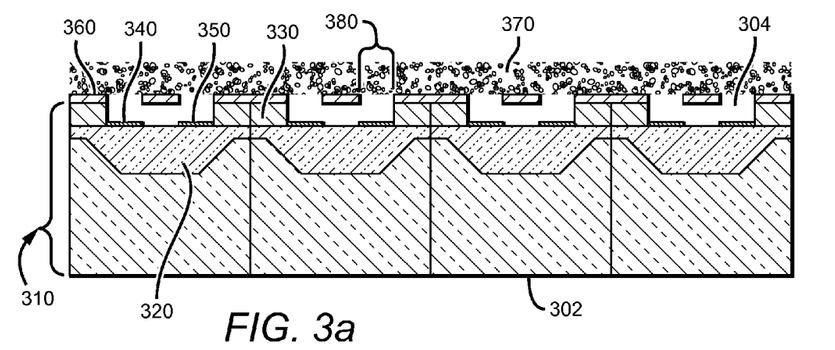
FIGS. 3a-3c are cross-sectional side views of a wafer or virtual wafer of devices, showing a method of forming contact bumps, according to an embodiment of the present disclosure.
Figure 3B:
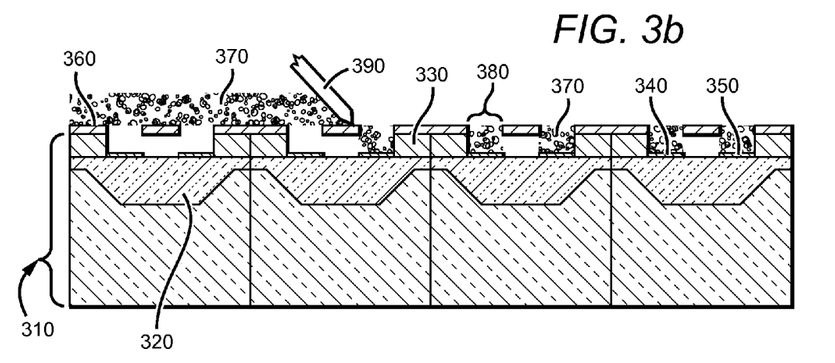
Figure 3C:
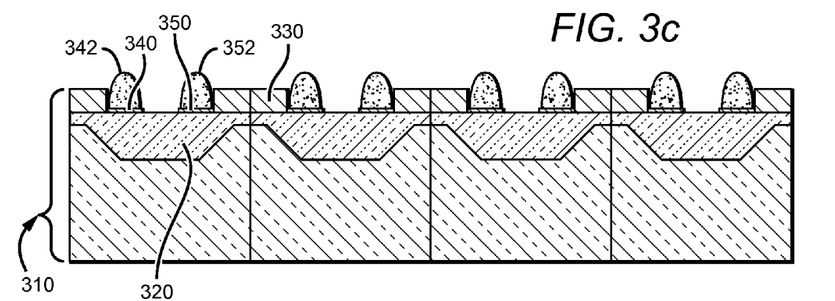

FIGS. 3a-3c show one embodiment of a method for providing contact bumps 342, 352 over the contact pads 340, 350, such that the contact bumps 342, 352 protrude beyond the lowest point of the mounting surface, in this case the reflective layer 330. Though the figures show 4 devices in the array, it is understood that a wafer or virtual wafer could include many more devices.

FIGS. 3a-3c are cross-sectional views of an array of devices arranged for wafer level processing. Wafer level processing may also refer to virtual wafers. In FIG. 3a, an adhesive, such as a tape based adhesive, is deposited and/or laminated on the top surface 302 of the array of devices. Optionally the adhesive may be placed on a carrier wafer, for example, a substrate commonly used in the art for mounting LED chips, such as a sapphire or silicon carbide substrate. This allows for the formation of a "virtual wafer" in which an array of LED dies can be deposited thereon. It is understood that the use of a carrier wafer is optional and provides the advantage of improving the structural integrity for the array; however, the virtual wafer may be created without the carrier wafer. Virtual wafers and integrated phosphors have been disclosed in a copending U.S. patent application Ser. No. 14/053,404, filed Oct. 14, 2013, by Heikman et. al entitled "CHIP WITH INTEGRATED PHOSPHOR," assigned to CREE, Inc. The disclosures of this application are hereby incorporated by reference. Furthermore, the devices may be attached as shown in FIGS. 3a-3c or may be spaced apart.

FIG. 3a shows an array of devices 310, each device includes a diode or active region 320, contact pads 340, 350, and reflective layer 330. As described with relation to FIGS. 1 and 2a, the lowest point of the mounting surface 304 is the reflective layer 330, therefore, the contact pads 340, 350 are recessed in relation to the plane of the mounting surface 304 of the device 310. In order to form the contact bumps 342, 352, (FIG. 3c) a stencil 360, shown in FIGS. 3a and 3b, is provided over the mounting surface 304 over the array of devices 310, such that the stencil has openings aligned with and over the contact pads 340, 350. This stencil may be made of any material which can withstand the material deposition process, such as metal. The process of providing the contact bumps only requires one alignment step which is the alignment of the stencil 360 over the contact pads 340, 350. An electrically conductive or solder material 370 is provided over the stencil.

FIG. 3b shows the array of devices 310 of FIG. 3a while the material 370 is being distributed through the openings 380 into the areas over the contact pads 340, 350. The desired material for the contact bumps, any electrically conductive material 370, is provided over the stencil 360 and devices 310. In some embodiments this electrically conductive material 370 may be a solder material, such as a lead free alloy. In other embodiments, this material may be provided as a paste. In yet other embodiments, this material is one which, when melted, only wets to the contact pads 340, 350. This electrically conductive material 370, is then provided in the openings 380 in the stencil over the contact pads 340, 350.

As shown, a blade or squeegee 390 may be used to evenly distribute the material 370. The blade 390 is passed over the surface of the stencil 360 forcing an equal amount of material 370 through the openings 380 and into the cavities below over the contact pads 340, 350. This material may also fall around the contact pads 340, 350; however, the material will gather over the contact pads 340, 350 during the reflow process. The amount of material 370 which enters the cavity through openings 380 can be adjusted by varying the thickness of the stencil, size of the openings 380, amount of material provided over the stencil, and by changing the speed and pressure with which the blade distributes the material.

After the material 370 is distributed in the cavities 380 over the contact pads 340, 350, the stencil 360 may be removed and the devices 310 undergo a reflow process. During the reflow process, the material 370, or solder, gathers on the contact pads 340, 350 and attaches to the contact pads 340, 350 bonding together. The surface tension of the solder bump forms the contact bumps 342, 352 over and in contact with the contact pads 340, 350. These contact bumps 342, 352 protrude beyond the height of the reflective layer 330. These contact bumps 342, 352 can now be used to mount to any mount surface or device and create an electrical connection to the device 310. Therefore, the devices 310 may now be mounted to any surface or device and an electrical connection can be reliably made. The contact bumps 342, 352 can be attached to bare wires, printed circuit boards, or any type of submount, such as ceramic, metal core, etc. Thereby, the devices themselves are bumped and ready to be attached to a larger variety of systems, rather than bumping the surface that the devices will attach to. Additionally, the devices are bumped at the wafer, not package level, providing increased efficiency and requiring only a single alignment step.

Embodiments of the method described in relation to FIGS. 3a-3c allow for the placement of equal amounts of material on each contact pad. This allows for balanced devices, which are more reliable when mounted. In other embodiments, with other configurations, such as contacts which are not co-planar, it may be desirable to provide different amounts of material. This may be accomplished by providing a stencil with different sized openings. The process shown in FIGS. 3a-3c may be a low cost process, as it can use existing tools and material systems. Bumping by this process may also reduce solder bridging on the order of 100-300 microns. In other embodiments, rather than using a stencil and squeegee, the contact bump material may be distributed as preforms or through solder ink jetting techniques.

Inclusion of the reflective material 190 may be significant in increasing emission efficiency or the lumens per watt (LPW) of a device. This may be especially significant in embodiments, which do not have a submount or substrate below the device. In these embodiments, the use of a reflective layer or material can increase the LPW such that the device with the submount and the submount free device, though differing in physical size as the submount free device may be smaller, can have the same LPW output. The same device without the reflective layer can lose up to 70% of device efficiency.

Figure 4:
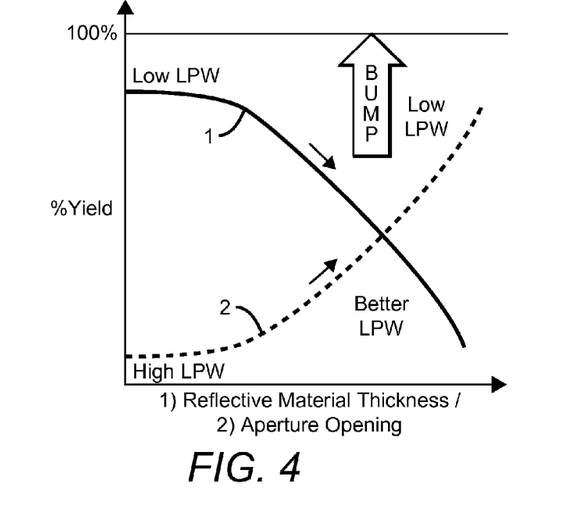
FIG. 4 is a chart showing the effects of reflective material thickness, aperture size, and bumping on lumens per watt and yield, according to an embodiment of the present disclosure.

FIG. 4 shows a chart depicting the impact of reflective material thickness (1) and aperture opening size, either in the stencil or the opening around the contact pads themselves (2) around the recessed contacts on LPW and yield, using traditional contacts and attachment methods. As shown, as the thickness (1) is increased, LPW improves but yield is reduced, as the contacts are further recessed. As the aperture opening is increased, the contacts are more exposed and the yield increases; however, LPW decreases as the reflective area is reduced. As shown by the large arrow, adding bumped contacts, as disclosed herein, allows the improvement of yield and a more efficient LPW device. Overcoming the height barrier of the reflective material enables attachment of devices with a reliably high yield. Using the methods disclosed herein, the contacts can be placed in a repeatable mass process. Additionally, the process allows for equal amounts of metal to be placed, which also improves reliability and the device will not be unbalanced. Also, taller solder joints, due to bumping, offer higher solder joint reliability by better absorbing strains generated during thermal expansion mismatch, due to temperature excursions, during operational life.

As stated previously, the amount of material disposed over the contact pads may be adjusted by changing the stencil thickness, aperture size, and speed or force with which the blade is moved over the stencil. Therefore a variety of different combinations of these measurements may be able to provide the desired result. Additionally, the desired result may vary on device size and application of the device. In an exemplary embodiment, a device with the size of 500 microns is in use. This device may have a reflective layer of 25-50 microns, though other devices may have layers which are less than 25 microns, or greater, such as up to 125 microns. For such a device, a stencil thickness in the range of 25-50 microns may be used. A stencil of 25 microns thickness may be preferred. The force of the blade for this configuration may range from 50 gms force to 5000 gms force. However, it is understood that these are exemplary ranges and that any set of numbers may be used to achieve the desired result.

Figure 5A:
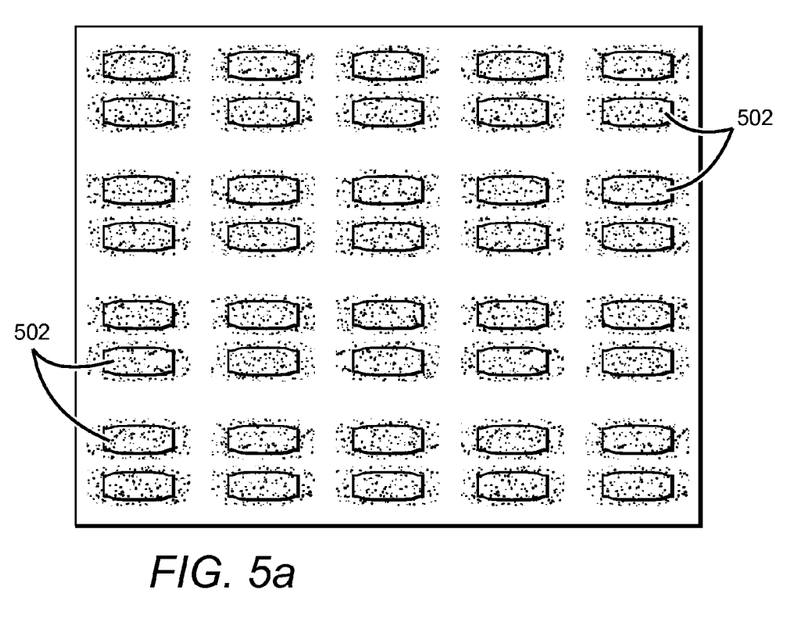
FIGS. 5a-5b are top views of a wafer or virtual wafer of devices, showing a contact formation, according to an embodiment of the present disclosure.
Figure 5B:
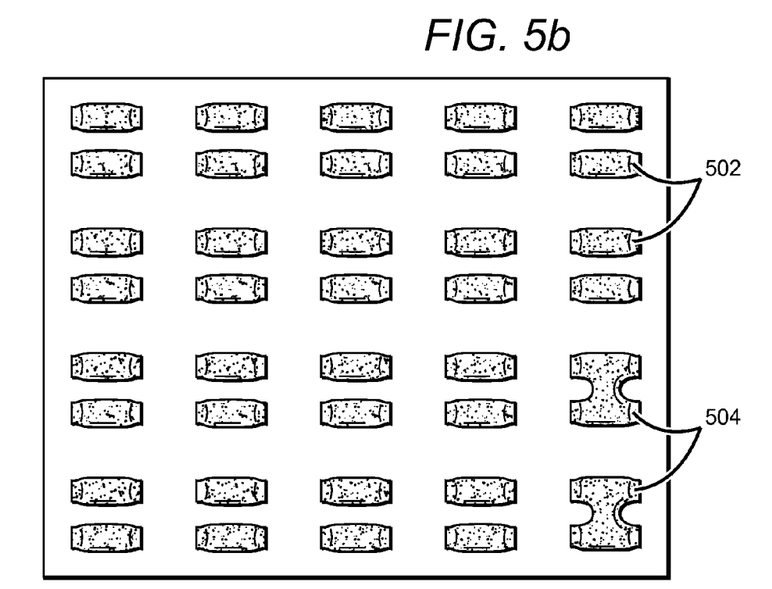

FIGS. 5a-5b show a virtual wafer of devices. FIG. 5a shows the devices 502 with the bumping material placed over the contact pads, after the stencil is removed, but before the reflow process. The bumping or solder material does not need to be placed neatly over only the contacts, as the material will move together and only bond with the contact pads during reflow. FIG. 5b shows the devices 502 after the reflow process. However, as shown, if the amount of material is in great excess or not adjusted correctly, some contact bumps may bridge and form a singular short circuited contact as those of a few shown devices 504. In order to prevent such bridging, the amount of material disposed must be reduced, disposed at the accurate amount, and/or a solder dam may be placed between the contacts. Though the solder dam is not necessary, as the amount of material may be adjusted instead, the dam may be used. For example, the reflective layer may extend between the contacts and act as a solder dam. Other types of barriers or solder dams besides the reflective layer may also be used.

Figure 6:
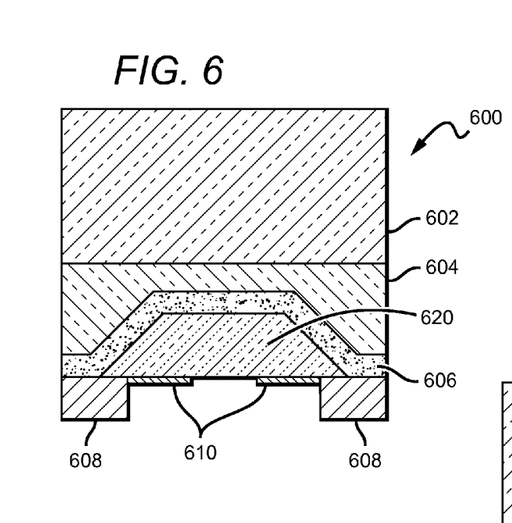
FIG. 6 is a cross-sectional side view of a device according to another embodiment of the present disclosure.
Figure 7:
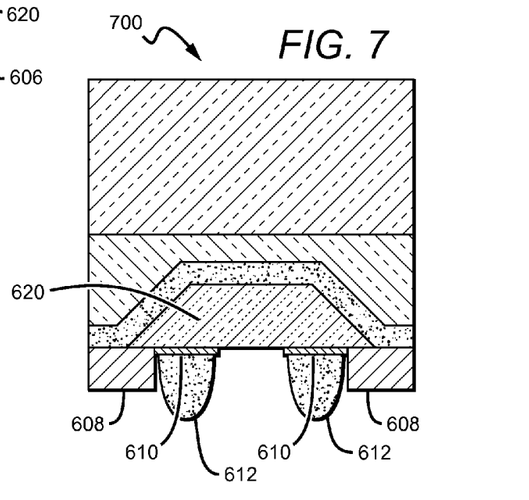
FIG. 7 is a cross-sectional side view of a device according to another embodiment of the present disclosure.

FIG. 6 is a side view of a device 600 with recessed contact pads 610. The device includes a glass lens 602 and silicon encapsulant 604. The lens or encapsulant may be shaped using roughening, dicing, etching elements, molding or may be preshaped, a partial hemisphere, or may include concentric rings. Though the current shape is square or rectangular, any shape is appropriate, and any light extraction features may be used. The device 600 includes a wavelength conversion material 606, diode or light output region 620. The device also includes a reflective layer 608, which raises the height of the surface adjacent to the mounting area, thereby recessing the contact pads 610. The reflective layer covers the perimeter of the surface, but in this embodiment, not on the contact pads or the area between the contact pads. FIG. 7 shows a similar device 700 with contact bumps 612 formed over the contact pads 610 such that the device may be mounted to a mounting surface and electrical contact can be made with the contact pads and the mounting surface.

Figure 8:
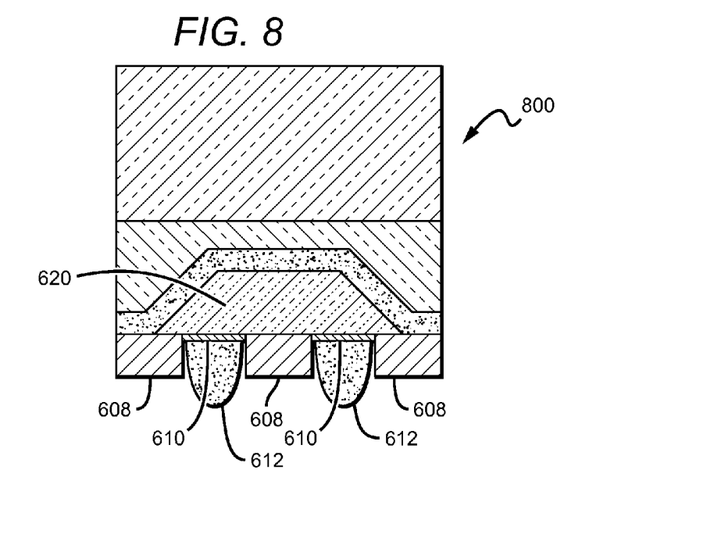
FIG. 8 is a cross-sectional side view of a device according to another embodiment of the present disclosure.
Figure 9:
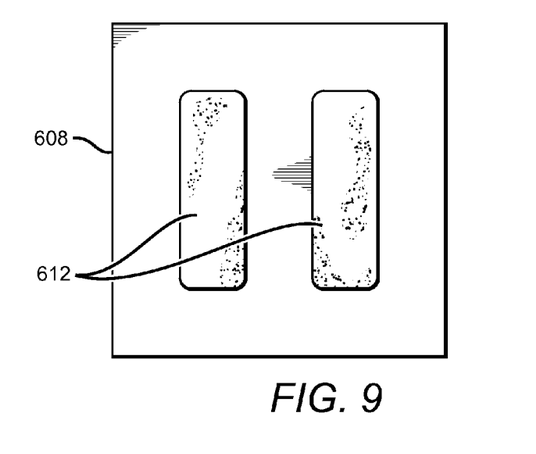
FIG. 9 is a bottom view of a device according to another embodiment of the present disclosure.

FIG. 8 shows another embodiment of a device 800 according to the present disclosure. This device 800 includes a portion of the reflective layer 608 between the contact pads 610 and bumps 612, such that this central portion may act as a solder dam during the formation of the contact bumps 612. FIG. 9 is a bottom view of a device similar to that of the device shown in FIG. 8, such that the device includes the reflective layer 608 on the bottom surface, or surface adjacent to the mounting surface. The reflective layer 608 is disposed on most areas of this surface of the device, but not on the contact pads 610 or bumps 612.

Figure 10A:
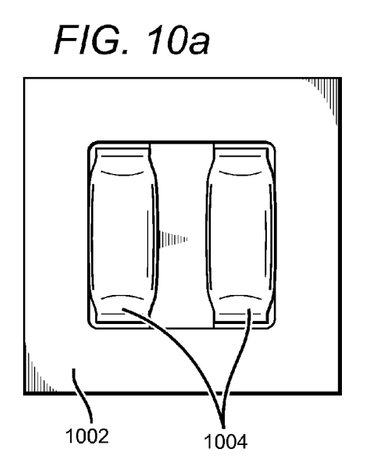
FIGS. 10a-10c are bottom, side perspective, and side views, respectively, of a device according to another embodiment of the present disclosure.
Figure 10B:
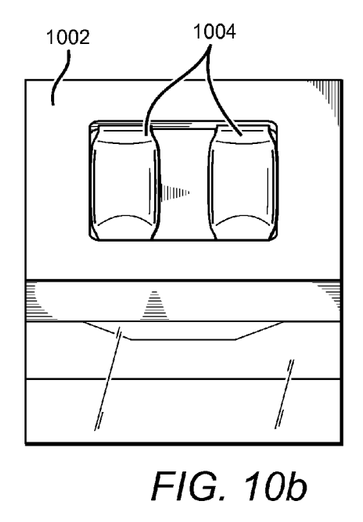
Figure 10C:
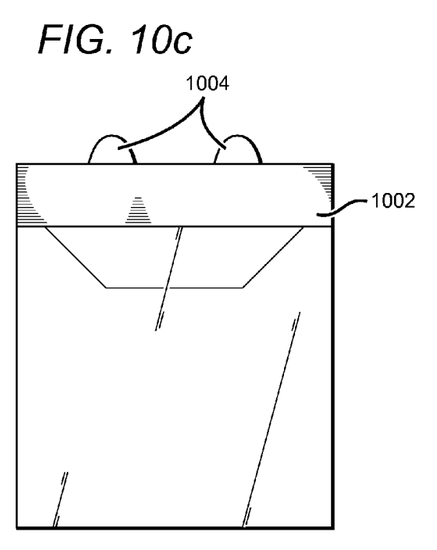

FIGS. 10a-10c show various views of a device according to the present disclosure, which included bumped contacts, such that the bumped contacts protrude beyond the mounting or bottom surface. FIG. 10a is a bottom view and the reflective layer 1002, here a white paint, is shown disposed around the perimeter of the mounting surface of the device. The contact bumps 1004 over the contact pads are disposed within the perimeter of the reflective material. FIG. 10b is a side perspective view of the same. Lastly, FIG. 10c is a side view of the same more clearly showing the contact bumps 1004, which protrude over the reflective layer 1002.

Figure 11:
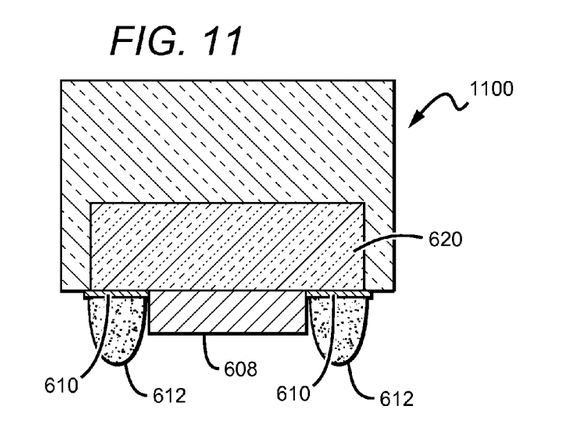
FIG. 11 is a cross-sectional side view of a device according to another embodiment of the present disclosure.
Figure 12:
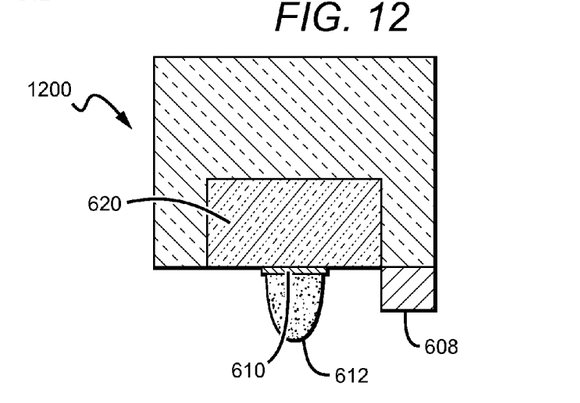
FIG. 12 is a cross-sectional side view of a device according to another embodiment of the present disclosure.

FIGS. 11 and 12 show additional embodiments of a device 1100 and 1200 according to the present disclosure. Features similar to those found in FIGS. 6-8 2a are referred to by the same numerals for ease of reference. FIG. 11 shows an embodiment in which the reflective layer 608 is only disposed between the contact pads. This may be advantageous in various embodiments to control or shape emissions in a desired manner. FIG. 12 shows an embodiment in which the reflective layer 608 is disposed on one side of the device. FIGS. 11 and 12 demonstrate exemplary embodiments and show that the reflective layer may be disposed on any portion of the device. Additionally, as shown, the devices may have any number of contacts on the bottom surface. In yet other embodiments, more than two contacts may be utilized.

As described above, these devices with the protruding contact bumps may be mounted to a surface such as a printed circuit board, wherein the diode region 620 of FIG. 7 faces the printed circuit board and is connected to the printed circuit board without an intervening submount or interposer between the diode region 620 and the printed circuit board. The printed circuit board may include any conventional printed circuit board material that is used to mechanically support and electrically connect electronic components using conductive pathways, tracks or signal traces. The printed circuit board may comprise laminate, copper-clad laminates, resin-impregnated B-stage cloth, copper foil, metal clad printed circuit boards and/or other conventional printed circuit boards. In some embodiments, the printed circuit board is used for surface mounting of electronic components thereon. The printed circuit board may include multiple light emitting devices 700, 800, 100, or any other device, thereon, as well as one or more integrated circuit chip power supplies, integrated circuit chip LED controllers and/or other discrete and/or integrated circuit passive and/or active microelectronic components, such as surface mount components thereon.

A printed circuit board may include an anode pad and a cathode pad. The anode pad and cathode pad providing connection surfaces of the printed circuit board, such that said surfaces and pads would connect to the contact bumps 612 of the devices directly or via a solder material. Solder layers of the printed circuit board or the device may comprise eutectic gold/tin solder, in solder bump, solder paste and/or solder preform form, and may also include other solder compositions, such as lead/tin solders, tin/silver/copper solders, known as "SAC" solder and/or other solder configurations.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

We claim:

1. A surface mount device, comprising:
   a first surface and a second surface opposite the first surface;
   a diode region on said first surface;
   a substrate on said diode region, said substrate having first and second opposing faces, said second face having a smaller surface area than said first face;
   a plurality of contact pads on the first surface of the surface mount device, each contact pad comprising a first edge and a second edge;
   a reflective layer on the first surface of the surface mount device, in which the reflective layer is on a perimeter of the first surface of the device and does not extend over said contact pads, the reflective layer having a height such that a contact height of the plurality of contact pads is recessed in relation to the height of the reflective layer; and
   a plurality of contact bumps formed on the respective contact pads, each contact bump comprising first and second edges which are between said first edge and said second edge of said contact pad, in which the plurality of contact bumps extend from the contact height to beyond the height of the reflective layer, wherein the reflective layer at least partially surrounds and is physically separated from the plurality of contact bumps, and wherein the plurality of contact bumps are accessible through the reflective layer to electrically access the surface mount device.

2. The surface mount device of claim 1, wherein said surface mount device comprises a solder dam between said contact pads.

3. The surface mount device of claim 1, wherein said reflective layer comprises at least a portion of said first surface of the surface mount device.

4. The surface mount device of claim 1, wherein said reflective layer comprises a white paint material.

5. The surface mount device of claim 1, wherein said reflective layer comprises a thickness in the range of 5-200 microns.

6. The surface mount device of claim 1, wherein said contact bumps comprise a solder material.

7. The surface mount device of claim 6, wherein said solder material comprises a lead free alloy.

8. The surface mount device of claim 1, wherein said surface mount device is a light emitting device.

9. The surface mount device of claim 8, further comprising an integrated wavelength conversion material.

10. The surface mount device of claim 8, further comprising an integrated encapsulant.

11. The surface mount device of claim 10, wherein said encapsulant comprises glass.

12. The surface mount device of claim 10, wherein said encapsulant comprises silicone.

13. The surface mount device of claim 10, wherein said encapsulant is shaped to impact light emission.

14. The surface mount device of claim 1, wherein said contact pads are on said diode region.

15. The surface mount device of claim 1, wherein said contact bumps are substantially the same size.

16. The surface mount device of claim 1, wherein said first surface of said device is capable of being mounted to a submount via the contact bumps and wherein an electrical connection is made through said contact bumps.

17. A light emitting device chip wafer, comprising:
   a plurality of light emitting devices, each light emitting device in the plurality of light emitting devices comprising:
   a first surface and a second surface opposite the first surface;
   a diode region comprising a face and an oblique sidewall, wherein said oblique sidewall extends at an oblique angle from said first surface to said face;
   a plurality of contact pads on the first surface of the surface mount device, each contact pad comprising a first edge and a second edge;
   a reflective layer on the first surface of the surface mount device, in which the reflective layer is on a perimeter of the first surface of the device and does not extend over said contact pads, the reflective layer having a height such that a contact height of the plurality of contact pads is recessed in relation to the height of the reflective layer; and a plurality of contact bumps formed on the respective contact pads, each contact bump comprising first and second edges which are between said first edge and said second edge of said contact pad, in which the plurality of contact bumps extend from the contact height to beyond the height of the reflective layer, wherein the reflective layer at least partially surrounds and is physically separated from the plurality of contact bumps, and wherein the plurality of contact bumps are accessible through the reflective layer to electrically access the surface mount device.

18. The device wafer of claim 17, wherein said contact bumps are substantially the same size.

19. The device wafer of claim 17, wherein said devices comprises a solder dam between said contact pads.

20. The device wafer of claim 17, wherein said devices are surface mount devices.

21. The device wafer of claim 17, wherein said devices further comprise an integrated wavelength conversion material.

22. The device wafer of claim 17, wherein said devices further comprise an integrated encapsulant.

23. The device wafer of claim 22, wherein said encapsulant comprises glass.

24. The device wafer of claim 22, wherein said encapsulant comprises silicone.

25. The device wafer of claim 22, wherein said encapsulant is shaped to impact light emission.

26. The device wafer of claim 17, wherein said contact pads are on said diode region.

27. The device wafer of claim 26, wherein said first surface of said devices is capable of being mounted to a submount via the contact bumps and wherein an electrical connection is made through said contact bumps.

28. The device wafer of claim 17, wherein said reflective layer is on said diode region, such that said reflective layer comprises a portion of said first surface and protrudes beyond said contact pads.

29. The device wafer of claim 17, wherein said reflective layer comprises a white paint material.

30. The device wafer of claim 17, wherein said reflective layer comprises a thickness in the range of 5-200 microns.

31. The device wafer of claim 17, wherein said contact bumps comprises a solder material.

32. The device wafer of claim 31, wherein said solder material comprises a lead free alloy.

33. A surface mount device, comprising:
a first surface;
a diode region comprising a face and an oblique sidewall, wherein said oblique sidewall extends at an oblique angle from said first surface to said face;
a plurality of contact pads on the first surface of the surface mount device, each contact pad comprising a first edge and a second edge;
a reflective layer on the first surface of the surface mount device, in which the reflective layer is on a perimeter of the first surface of the device and does not extend over said contact pads, the reflective layer having a height such that a contact height of the plurality of contact pads is recessed in relation to the height of the reflective layer; and
a plurality of contact bumps formed on the respective contact pads, each contact bump comprising first and second edges which are between said first edge and said second edge of said contact pad, in which the plurality of contact bumps extend from the contact height to beyond the height of the reflective layer, wherein the reflective layer at least partially surrounds and is physically separated from the plurality of contact bumps, and wherein the plurality of contact bumps are accessible through the reflective layer to electrically access the surface mount device.

34. The surface mount device of claim 33, said reflective layer comprising at least a portion of said first surface.

35. The surface mount device of claim 34, wherein said reflective layer comprises a thickness in the range of 5-200 microns.

36. The surface mount device of claim 33, wherein said bump comprises a solder material.

37. The surface mount device of claim 33, wherein said surface mount device is a light emitting device.

38. The surface mount device of claim 37, further comprising an integrated wavelength conversion material.

39. The surface mount device of claim 37, further comprising an integrated encapsulant.

40. The surface mount device of claim 39, wherein said encapsulant is shaped to impact light emission.

41. The surface mount device of claim 33, wherein at least one of said pads are electrically connected to said diode region.

42. The surface mount device of claim 33, wherein at least one of said pads are electrically isolated from said diode region.

43. The surface mount device of claim 33, wherein said bumps are substantially the same size.

44. The surface mount device of claim 33, wherein said first surface of said device is capable of being mounted to a submount via the bumps.

45. The surface mount device of claim 44, wherein an electrical connection is made through said bumps.

* * * * *